United States Patent [19]

Aoyama

[11] Patent Number: 4,900,939
[45] Date of Patent: Feb. 13, 1990

[54] SYSTEM FOR PROCESSING AND CONVEYING SUBSTRATE

[75] Inventor: Masaaki Aoyama, Kawasaki, Japan

[73] Assignee: Nikon Corporation, Tokyo, Japan

[21] Appl. No.: 290,356

[22] Filed: Dec. 27, 1988

[30] Foreign Application Priority Data

Jan. 5, 1988 [JP] Japan ..................... 63-455

[51] Int. Cl.⁴ .................. G01N 21/86; G01V 9/04
[52] U.S. Cl. ......................... 250/548; 356/401
[58] Field of Search .................. 250/548, 557, 561; 356/400, 401

[56] References Cited

U.S. PATENT DOCUMENTS

| | | | |
|---|---|---|---|
| 4,653,008 | 3/1987 | Kai et al. | 250/548 |
| 4,677,301 | 6/1987 | Tanimoto et al. | 250/548 |
| 4,780,615 | 10/1988 | Suzuki | 356/400 |

Primary Examiner—David C. Nelms
Assistant Examiner—William L. Oen
Attorney, Agent, or Firm—Shapiro and Shapiro

[57] ABSTRACT

A substrate processing system basically comprises a coater-developer apparatus, an exposure processing apparatus and a conveyance controlling apparatus. The coater-developer apparatus comprises a coater unit including a coater for applying photo-resist on the substrate, and a developer unit for developing the substrate. The exposure processing apparatus includes an exposing means, and an inspection means for inspecting the photo-resist pattern on the substrate. The conveyance controlling apparatus conveys or feeds the substrate through the coater unit, exposure processing apparatus and developer unit in order. The conveyance controlling apparatus includes means forming a first conveying path for conveying a wafer from a loader cassette to the exposure processing apparatus through the coater unit, means forming a second conveying path for conveying the wafer from the exposure processing apparatus to an unloader cassette through the developer unit, and auxiliary conveying means forming a third conveying path for directly conveying the wafer on the first conveying path to the exposure processing apparatus without through the coater unit or directly conveying the wafer on the second conveying path to the exposure processing apparatus without through the developer unit. The wafer is returned from the second conveying path to an inspection device in the exposure processing apparatus by means of the auxiliary conveying means, and a forming state of a resist pattern formed on the wafer is checked by the inspection device. Further, there is provided a main controller for determining an optimum forming condition for the resist pattern on the basis of the checked forming state and for properly controlling a processing condition of either coater-developer or exposing means to process the wafer in accordance with the determined optimum condition.

7 Claims, 5 Drawing Sheets

SYSTEM FOR PROCESSING AND CONVEYING SUBSTRATE

BACKGROUND OF THE INVENTION

1. Field of the Invention

The present invention relates to a substrate processing system for sequentially performing various processes or treatments on a thin substrate such as a semi-conductor wafer, liquid crystal substrate and the like, and more particularly it relates to a substrate processing system for manufacturing a semi-conductor element wherein circuit patterns are formed on a semi-conductor wafer.

2. Related Background Art

In the past, in processes for manufacturing a semiconductor element, particularly, in lithography processes for forming circuit patterns of elements on a semi-conductor wafer (referred to merely as "wafer" hereinafter), a substrate processing or treating system comprising a resist processing apparatus (referred to as "coater-developer" hereinafter) mainly including a plurality of wafer processing devices, and an exposing apparatus of step-and-repeat contraction scale projection type (i.e., a wafer-stepper referred to merely as "stepper" hereinafter) has been used. In this system, the wafer is conveyed only in one direction through the system by means of a conveying apparatus such as a belt conveyor and the like to undergo various processes or treatments, and the processed wafer has circuit patterns of a mask or reticle (referred to generically as "reticle" hereinafter) formed thereon. However, recently, a line width of the circuit patterns to be transferred onto the wafer has been requested to be in the order to sub-microns, and a positive type resist which has higher resolving power than that of a negative type resist and is fragile and hydrophobic and is sensitive to developing treatment conditions (for example, temperature and/or density of liquid developer and the like) has been used. Consequently, unless the wafer is processed by means of all of the apparatuses constituting the substrate processing system at an optimum pattern forming condition, the semi-conductor element having a desired feature cannot be obtained. Thus, in the substrate processing system of this kind, the coater-developer and the stepper are constituted as inline type, and further, before the coater-developer is applied to the resist, various processing conditions regarding the resist applying process and developing process and care of the wafer are controlled by a microcomputer and the like. In this case, in order to process or treat the wafer at the optimum pattern forming condition by means of such substrate processing system, it is necessary to determine the optimum forming condition at the initiation of operation of the substrate processing system. To this end, first of all, a test reticle pattern is formed on the wafer at a predetermined condition which has been previously inputted or stored at the initiation of operation of the system, the wafer is manually transported to an inspection device where the formed condition or state of the test reticle pattern is checked or detected. A line width of the test reticle pattern and the like are measured by the inspection device, and the optimum forming condition is determined on the basis of the measured value and a desired value for the test reticle pattern previously inputted. Next, the determined optimum forming condition is fed back to the microcomputer and the like for wholly controlling the coater-developer thereby setting the forming condition regarding the respective wafer processing apparatuses such as a developing apparatus constituting the coater-developer.

By using the substrate processing system in which the forming condition has been set in the above-mentioned manner, a circuit pattern for a semi-conductor device is sequentially formed on the wafer.

However, in such conventional substrate processing system comprising the coater-developer and the stepper, the substrate processing system itself and the inspection device were not constituted as inline type, and thus, there arose a problem that the circuit pattern formed on the wafer had a defect due to generation of dust and the like. Further there was a further problem that through-put was decreased since it took a long time to set the forming condition of the respective wafer processing apparatuses constituting the coater-developer. In addition, if the substrate processing system and the inspection device were constituted as the inline type, there arose a problem that the substrate processing system would be large-sized, complex and expensive.

SUMMARY OF THE INVENTION

An object of the present invention is to prevent reduction or decrease of through-put by reducing or shortening a set-up time of a substrate processing system.

Another object of the present invention is to provide a substrate processing system which can process a wafer at an optimum forming condition and form a reticle circuit pattern on the wafer with high accuracy.

A system according to the present invention basically comprises a coater-developer apparatus, an exposure processing apparatus and a conveyance controlling apparatus.

The coater-developer apparatus comprises a coater unit including a coater for applying photo-resist on the substrate, and a developer unit for developing the substrate.

The exposure processing apparatus includes an exposing means, and an inspection means for inspecting the photo-resist pattern on the substrate.

The conveyance controlling apparatus conveys or feeds the substrate through the coater unit, exposure processing apparatus and developer unit in order.

The conveyance controlling apparatus includes means forming a first conveying path for conveying a wafer from a loader cassette to the exposure processing apparatus through the coater unit, means forming a second conveying path for conveying the wafer from the exposure processing apparatus to an unloader cassette through the developer unit, and auxiliary conveying means forming a third conveying path for directly conveying the wafer on the first conveying path to the exposure processing apparatus without through the coater unit or directly conveying the wafer on the second conveying path to the exposure processing apparatus without through the developer unit. The wafer is returned from the second conveying path to a inspection device in the exposure processing apparatus by means of the auxiliary conveying means, and a forming state of a resist pattern formed on the wafer is checked by the inspection device. Further, there is provided a main controller for determining an optimum forming condition for the resist pattern on the basis of the checked forming state and for properly controlling a processing condition of either coater-developer or exposing means to process the wafer in accordance with the determined optimum forming condition.

In the present invention, by providing the auxiliary conveying means separately from the main conveying means, a line width of the reticle circuit pattern formed on the wafer can be measured by utilizing a laser-step-alignment system provided in the exposure means, i.e., stepper. Further, the main controller is so constructed as to determine the optimum forming condition on the basis of the measured value and a desired value and to properly feedback control at least one of the coater-developer and stepper in accordance with the determined forming condition.

Consequently, the defect of the circuit pattern formed on the wafer can effectively be prevented from occurring, and the semi-conductor can be manufactured at high production rate by shortening the set-up time by means of the high accurate and compact substrate processing system.

DETAILED DESCRIPTION OF THE PREFERRED EMBODIMENTS

Figure 1:
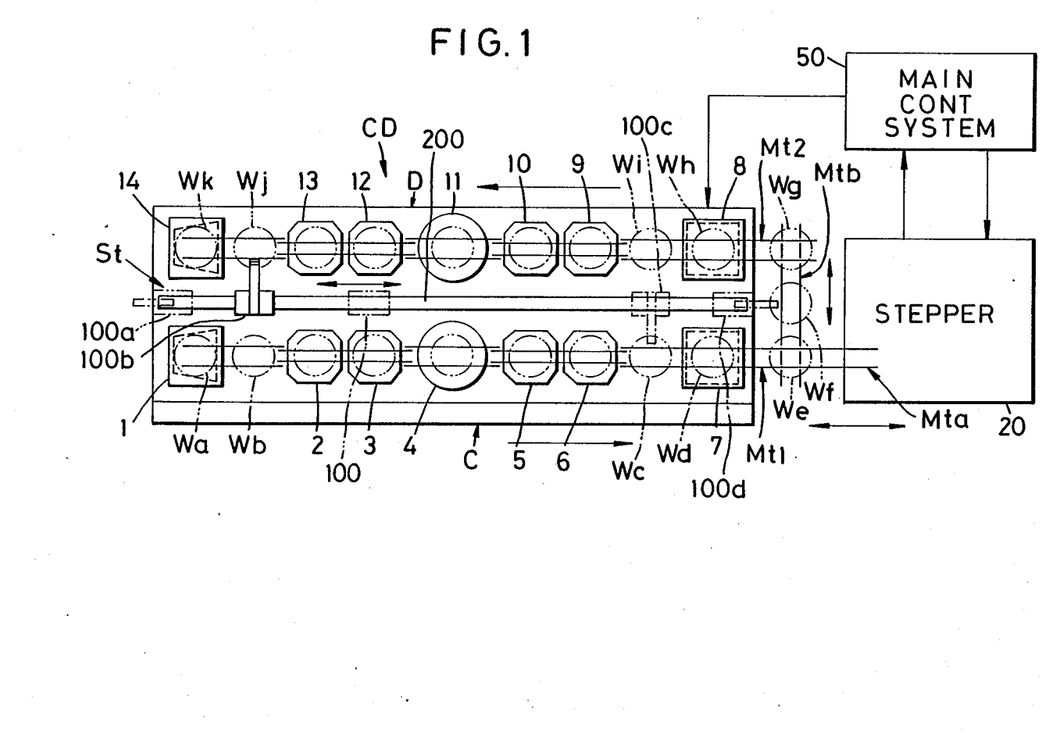
FIG. 1 is a schematic constructional plan view showing a substrate processing system according to a preferred embodiment of the present invention.
Figure 2:
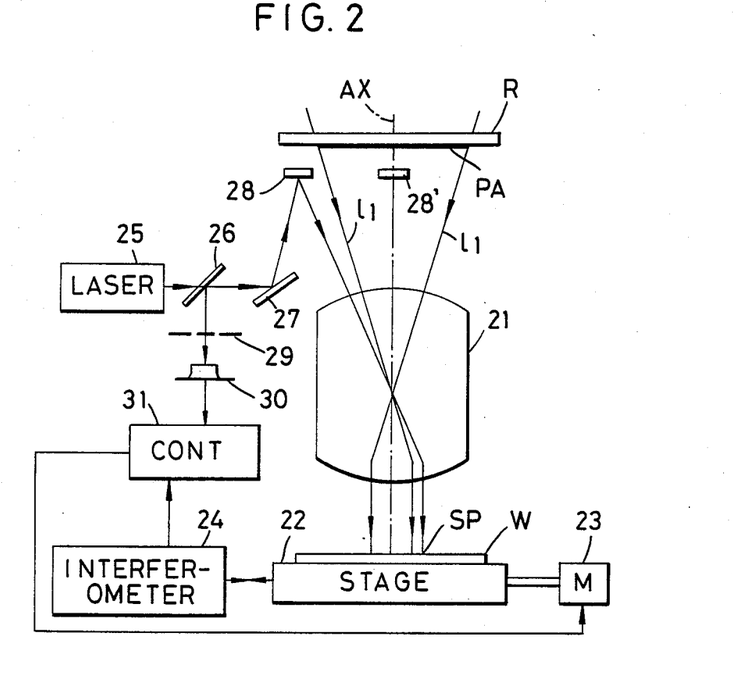
FIG. 2 is a schematic elevational view of a stepper in the system of FIG. 1.

The present invention will now be fully explained in connection with the accompanying drawings. FIG. 1 shows a schematic construction of a substrate processing system according to a first embodiment of the present invention. FIG. 2 shows a schematic construction of a stepper 20 constituting a part of the substrate processing system and for transferring a pattern PA on a reticle R onto a wafer. The system includes a first conveying path Mt1 for conveying the wafer from a loader cassette 1 (wafer position Wa) to the stepper 20 and a second conveying path Mt2 for conveying the wafer from the stepper 20 to an unloader 14 (wafer position Wk), which first and second paths constitutes a main conveying path referred to as a main conveying means Mt hereinafter. However, it should be noted that the first conveying path Mt1 and the second conveying path Mt2 hold a conveying path portion Mta extending between a position We and the stepper 20 in common.

The main conveying means Mt and a coater-developer CD are already known in the art, and thus, the explanation regarding these elements is omitted. However, the main conveying means Mt according to the first embodiment of the present invention utilizes both of a belt conveying device and an air conveying device. The main conveying means Mt conveys or feeds the wafer from the loader cassette 1 (position Wa) to the unloader cassette 14 (position Wk) only in one direction sequentially. However, in this main conveying means Mt, the above-mentioned conveying path portion Mta extending between the position We and the stepper 20, and a conveying path portion Mtb extending between the position We and a position Wg are so constructed that the wafer can be fed in both directions in these conveying path portions.

Further, the coater-developer CD comprises a coater portion C including mainly a coater 4, and a developer portion D including mainly a developer 11. In addition, since respective wafer processing apparatuses including the coater-developer CD are constructed as modules, these apparatuses can be freely combined in a certain extent according to the treatment processes for the wafer. Now, an example thereof will be explained.

In FIG. 1, the coater-developer CD includes the coater portion C for performing a process before the resist is applied and a resist applying process, the developer portion D for performing a developing process, the loader cassette 1, the unloader cassette 14, and buffer cassettes 7, 8. Further, the coater-developer CD is constituted by a plurality of moduled wafer processing apparatuses (referred to as "wafer processing unit" hereinafter).

The process before the resist is applied (preprocess) includes a hexamethyldisilazane (referred to as "HMDS" hereinafter) processing apparatus 2 and a cold plate 3. In this process, foreign matters adhered on the wafer are removed to facilitate the adhesion of the resist onto the wafer.

Next, the resist applying process includes the coater 4, a hot plate 5 and a cold plate 6. In this process, positive type resist is applied onto the wafer, and treatment for stabilizing the sensitivity of the positive type resist is effected.

The developing process includes the developer 11, hot plates 19, 20, and cold plates 10, 13. In this process, a circuit pattern of the reticle, i.e., a resist pattern RP is imprinted on the wafer.

The buffer cassettes 7 and 8 are provided for temporarily receiving the wafer when the cycle time of the substrate processing system is adjusted in consideration of different processing times of the respective wafer processing units.

The stepper 20 acts to transfer the circuit pattern provided on the back surface of the reticle to the wafer. Since the concrete construction of the stepper as shown in FIG. 2 is already known, for example, as disclosed in the U.S. Pat. No. 4,677,301, the stepper will be briefly explained here.

The reticle R on which a predetermined circuit pattern (including marks used for an alignment operation) is formed is precisely positioned with respect to an optical axis AX of a projection lens 21. A projected image of the circuit pattern from the reticle is transferred onto the wafer W positioned on a stage 22 which can be shifted two-dimensionally in X and Y directions. In FIG. 1, 11 indicates main light beams passing through a peripheral edge of the pattern area PA. The projection lens 21 used in this embodiment is an optical system which is non-telecentric in the reticle side and is telecentric in the wafer side.

The wafer stage 22 is driven by a motor 23, and the two-dimensional position (coordinates) of the stage is measured or checked by a laser interferometer 24. Further, in order to detect alignment marks (particularly, diffraction grating marks) previously formed on the wafer, a laser beam source 25, a half mirror 26 and mirrors 27, 28 are provided for illuminating laser light (comprising, for example, He-Ne Light beams, which does almost not sensitize the resist) onto the wafer. In this case, the laser light from the laser source 25 is focused as a spot light (seat beam) SP on the wafer through the projection lens 21.

The spot light SP is positioned at a predetermined distance from the optical axis AX outside of the projected image of the pattern area PA on the wafer. When the spot light SP illuminates on the mark, diffracted light, scattered light and specular reflected light are generated. These light beams pass through the projection lens 21 and is sent to an space filter 29 through the mirror 28, 29 and the half mirror 26.

The space filter 29 is arranged in conjugation with an incident pupil of the projection lens 21 so that the specular reflected light (zero-dimensional light) is shut out and the diffracted light (or scattered light is directed to a photoelectric detector 30 to produce a photoelectric signal which is inputted to a control circuit 31. On the other hand, the laser interferometer 24 detects a value of the coordinates of the position of the shifted wafer stage 22. The detected coordinate value from the interferometer 24 is also inputted to the control circuit 31. Thus, since the spot light SP is stationary in the projection field of the projection lens 21, the position of the mark formed on the wafer can be determined by the control circuit 31 on the basis of the inputted coordinate value and photoelectric signal.

The control circuit 31 controls the operation of the motor 23, and also performs a step-and-repeat exposure operation by an enhancement global alignment system (E.G.A.), for example, as described in the U.S. Ser. No. 915,027 filed on Oct. 3, 1986 (same assignee as the present application).

Hereinafter, the alignment system comprising the laser source 25, half mirror 26, mirrors 27, 28, space filter 29 and photoelectric detector 30 will be called or referred to as "laser step alignment system" (LSA system), and the control circuit 31 will be called or referred to as "laser step alignment system processing circuit 31" (LSAC). The center of detection of the LSA system coincides with the center of the spot light.

Further, the LSA system shown in FIG. 2 is provided for detecting the position of the wafer W, for example, only in the Y direction. It should be noted that, in practice, the similar LSA system for detecting the position of the wafer in the X direction is also provided. In this connection, in FIG. 2, a first mirror 28' of the X direction detecting LSA system corresponding to the first mirror 28 of the Y direction detecting LSA system is shown alone.

Now, an auxiliary conveying means St shown in FIG. 1 comprises a pick-up arm 100 and a linear motor guide 200. The pick-up arm 100 can be shifted along the linear motor guide 200 so that the pick-up arm can pick up the wafer by a vacuum force at any desired position in the substrate processing system and can convey said wafer up to a further any desired position in the substrate processing system.

Figure 3:
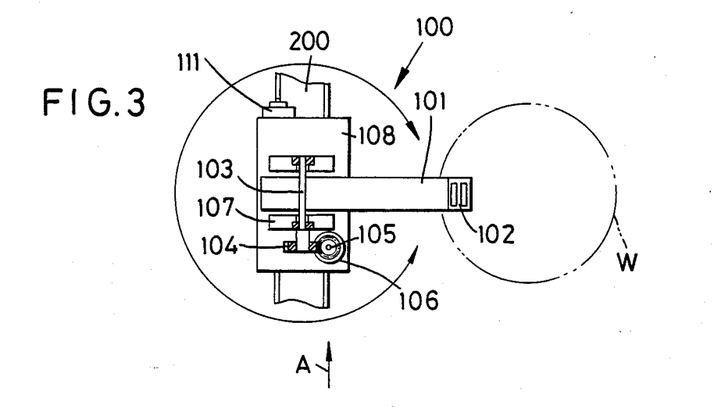
FIG. 3 is a schematic plan view of a pick-up arm in the system of FIG. 1.
Figure 4:
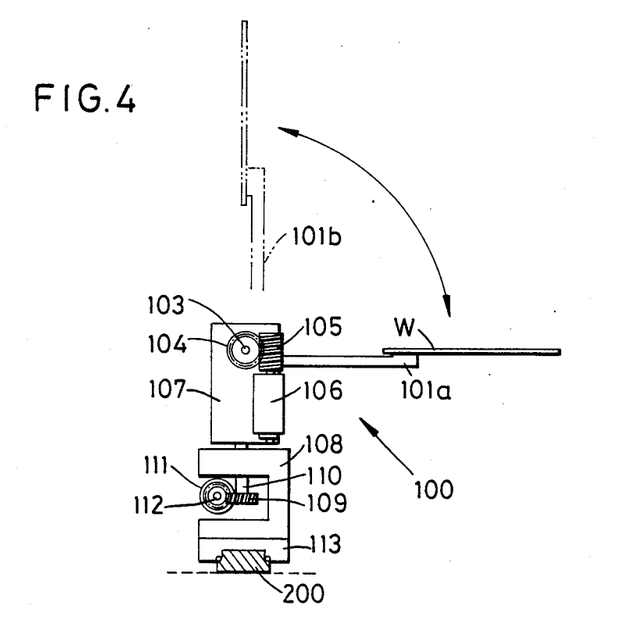
FIG. 4 is an elevational view looked at from a direction shown by an arrow A in FIG. 3.

FIGS. 3 and 4 show a schematic construction of the pick-up arm 100. The pick-up arm 100 includes an arm 101 which can be rocked within 90 degrees by means of a motor 106 through an arm rotating shaft 103, a worm wheel 104 and a worm 105. The arm 101 is provided at its free end with a vacuum sucking face 102 which can suck, by the vacuum force, a back surface of the wafer being processed and pick up the same and can convey said wafer to any desired position in the substrate processing system. The arm 101, arm rotating shaft 103, worm wheel 104, worm 105 and motor 106 are supported on a support 107.

In connection with the fact that the pick-up arm 100 is constituted to suck or pick up the back surface of the wafer by the vacuum force. The wafer can be picked up at least at positions Wb, Wc, Wf and Wj.

Further, the support 107 and accordingly the arm 101 can be rotated by 360 degrees around a worm wheel shaft 110 by means of a motor 111 through a worm wheel 109, the worm wheel shaft 110 and a worm 112 all of which are provided on a supporting base 108. Further, the pick-up arm 100 is shifted along the linear motor guide 200 by means of a linear motor unit 113 arranged on the bottom of the supporting base 108. The pick-up arm 100 can be shifted along the linear motor guide 200 between a position 100a and a position 100d shown in FIG. 1.

A main controller 50 shown in FIG. 1 includes a processor such as a microcomputer or minicomputer, and an interface circuit and the like, and can determine a forming condition (i.e., calculates an optimum forming condition) of the resist pattern in the coater-developer CD and in the stepper 20 and further wholly controls the whole substrate processing system including the above-mentioned LSA system.

Next, the operation of the substrate processing system according to the first embodiment will be explained with reference to the related drawings. In this case, it is assumed that the pick-up arm 100 is firstly positioned in the position 100d on the linear motor guide 200 and the arm 101 is positioned in a plane parallel to a conveying plane of the main conveying means Mt.

Now, the wafer started from the loader cassette 1 is conveyed by the main conveying means Mt through the pre-process before coating, the resist coating process, the exposing process and the developing process in order, so that the wafer is subjected to the respective treatments. That is to say, the wafer is shifted through the positions Wa-We, the stepper 20, the positions We-Wg-Wj in order. When the wafer reaches the position Wj, the resist pattern of the reticle has been formed on the processed wafer.

In this case, as the reticle, a test reticle (i.e., not a reticle for semi-conductor device), for example a reticle on which a plurality of parallel straight patterns are formed is used. Further, in this case, in order to enhance the accuracy of the measurement, the straight pattern wider than a minimum line width of the circuit pattern of the semi-conductor device is formed on this test reticle. For example, although a line width of the circuit pattern formed on the wafer is in the order of sub-microns, the line width of the straight pattern formed on the test reticle will be about 10 μm.

Further, the treatments performed on the wafer is controlled by the main controller 50 in such a manner that the wafer is treated or processed by the stepper 20 and the respective processing units constituting the coater-developer CD on the basis of a previously inputted predetermined forming condition regarding the resist pattern.

Next, the main controller 50 checks the forming condition of the resist pattern formed on the wafer by utilizing the LSA system provided in the stepper 20. To this end, at first, the main controller 50 moves the pick-up arm 100 along the linear motor guide 200 from the position 100d to a position 100b before the wafer to be checked has reached the position Wj. In this case, the arm 101 has been lifted by a certain angle from the conveying plane or has been shifted vertically by means of the motor 106 through the arm rocking elements 103–105.

Next, the arm 101 being maintained in the above condition is turned or rocked by 90 degrees by means of the motor 111 through the arm rocking elements 109–111 in the position 100b on the linear motor guide 200. Then the arm 101 is lowered to be parallel to the conveying plane again by means of the motor 106 to prepare a condition that the pick-up arm 100 can pick up, by the vacuum force, the wafer conveyed to the position Wj by the main controller 50.

Next, the pick-up arm 100 picks up the wafer reached the position Wj by sucking, by the vacuum force, the back surface of the wafer by means of the vacuum sucking face 102 arranged on the free end of the arm 101. Then, the arm 101 carrying the wafer thereon is lifted vertically or by a certain angle from the conveying plane by means of the motor 106. In this condition, the pick-up arm 100 is shifted along the linear motor guide 200 from the position 100b to the position 100d. Then the arm 101 is turned by 90 degrees by the motor 111, and thereafter is lowered by the motor 106 to be parallel to the conveying plane (i.e., the wafer is also parallel to the conveying plane). In this case, the arm 101 is lowered so that the wafer contacts with the conveyor belt of the main conveying means Mt.

Next, the wafer is released from the vacuum sucking face 102 to bring it on the position Wf in the conveying path. Then, the wafer positioned in the position Wf is shifted to the position We by the conveying path portion Wtb which constitutes a part of the main conveying means Mt and can move in both directions. The wafer reached the position We is then sent to the stepper 20 by means of the conveying path portion Mta having the same construction as that of the conveying path portion Mtb.

Next, in the stepper 20, the wafer is positioned on the wafer stage 22, and the line width of the resist pattern RP formed on the wafer is measured by the LSAC 31 by using the spot light SP from the LSA system.

Figure 5A:
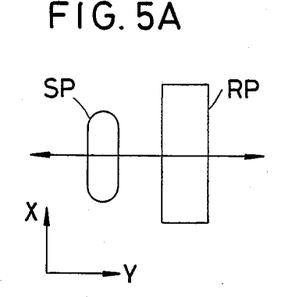
FIG. 5A is a plan view showing a resist pattern to be scanned by a light spot.
Figure 5B:
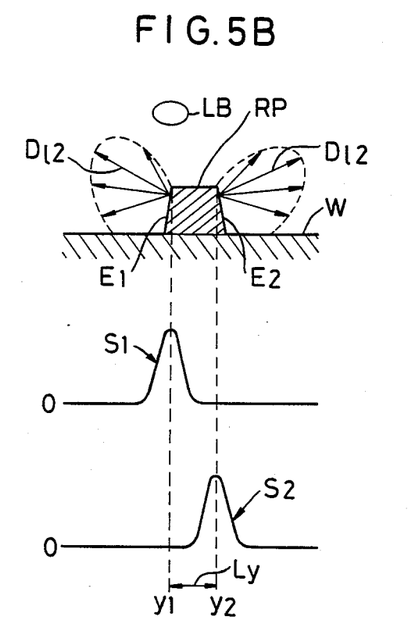
FIG. 5B is a view showing a vertical section of the resist pattern of FIG. 5A and further showing wave forms of photoelectric signals.

Further, the explanation will be continued with reference to FIGS. 5A and 5B. FIG. 5A shows a condition that the resist pattern RP is scanned by the spot light SP, and FIG. 5B shows a section of the resist pattern RP in the scanning direction and wave forms of the photoelectric signals. It should be noted that, since the resist pattern RP is so provided that the line width thereof is measured by the LSA system for detecting the position of the resist pattern in the Y direction, the spot light SP and the resist pattern RP both extend in the X direction.

In this connection, the LSAC 31 shifts the wafer stage 22 in such a manner that the resist pattern RP is relatively scanned in the Y direction by the spot light SP. In this case, if a center of a bundle LB of the laser beams coincides with a stepped edge E1 in a position y1, scattering light Dl1 is generated in a space adjacent to the stepped edge E1, and the photoelectric signal from the photoelectric detector 30 will have a peak value as shown by a wave form S1. As the resist pattern RP is further scanned by the spot light SP, if the canter of the bundle LB of the laser beam coincides with the other stepped edge E2 in a position y2, scattered light Dl2 is generated in a space adjacent to the stepped edge E2, and the photoelectric signal from the photoelectric detector 30 will have a peak value as shown by a wave form S2.

The LSAC 31 detects Y-coordinate values Y1 and Y2 of the positions y1 and y2 where the wave forms S1 and S2 of the photoelectric signal are the peak values, respectively, from the laser interferometer 24. The line width Ly of the resist pattern RP is calculated on the basis of these coordinate values Y1 and Y2, and the calculated value Ly is stored.

After the measurement of the line width of the resist pattern formed on the wafer is completed, the wafer is discharged from the stepper 20 in the reverse manner as the wafer is introduced into the stepper 20. That is to say, the wafer is conveyed up to the position We by the conveying path portion Mta and then is conveyed from the position We to the position Wf. Then, the wafer is picked up by the pick-up arm 100 and conveyed to the position Wj along the linear motor guide 200. Thereafter, the wafer is conveyed from the position Wj to the unloader cassette 14 (position Wk) by the conveying path Mt2 and received in the unloader cassette 14.

Next, the main controller 50 determines the optimum forming condition of the resist pattern such as developing conditions in the respective wafer processing units, a thickness condition of the resist film and the like, and the optimum forming condition of the resist pattern such as a focusing position, exposure value in the stepper 20 and the like, on the basis of the measured value (i.e., measured line width Ly) obtained from the LSAC 31 and the previously stored or inputted design line width. Further, the main controller 50 also properly feedback controls the coater-developer CD and the stepper 20 in accordance with the determined values so that the wafer is processed at the optimum resist pattern forming condition by means of the coater-developer CD and the stepper 20.

In this way, the preparation regarding the wafer processing operation such as the setting of the forming condition of the substrate processing system and the like is completed. Then the main controller 50 starts the wafer processing sequence, where the wafer accommodated in the loader cassette 1 is conveyed through the various processes sequentially and thus is processed to form a first layer of the circuit pattern of the reticle on the wafer. The wafer having the first layer formed thereon is subjected to an etching treatment and then is transferred to a further (second) substrate processing system having the same construction as the afore-mentioned substrate processing system and including a reticle having a second layer of the circuit pattern, where the wafer is similarly processed to superimpose or overlap the second layer of the circuit pattern on the first layer.

In this way, by repeating the similar processes as to the same wafer, ten or more reticle circuit patterns are superimposed on the wafer. The semiconductor element is obtained by exposing the wafer so processed.

With the arrangement mentioned above, since the wafer is conveyed to the stepper 20 by the auxiliary conveying means St provided separately from the main conveying means Mt, and the forming condition of the resist pattern RP is detected by the LSA system provided in the stepper 20, and further the main controller 50 feedbacks the optimum forming condition to the coater-developer CD and the stepper 20, the occurrence of the defect of the circuit pattern due to adhesion of foreign matters, and the reduction of the through put can be effectively prevented, thereby forming the high accurate semi-conductor element on the wafer.

By using the substrate processing system according to the first embodiment of the present invention, for example, it is possible that, before the photoresist applied to the wafer is exposed, the wafer is once introduced into the stepper by means of the auxiliary conveying means, where the thickness of the photoresist is measured, and the exposure value in the stepper is controlled on the basis of the optimum forming condition derived from the measured value.

In the afore-mentioned first embodiment, the conveying path portion Mta for shifting the wafer is provided as an interface between the coater-developer CD and the stepper 20, and the conveying path portion Mta is constructed to convey the wafer in opposite directions, and the wafer is introduced into and discharged from the stepper 20 by means of this conveying path portion Mta. However, as shown in FIG. 6, it may be constructed that the wafer is introduced into the stepper by the conveying path portion Mta moving only in one direction and is discharged from the stepper 20 by a conveying path portion Mtc moving only in one direction.

More particularly, in this embodiment, the pick-up arm 100 of the auxiliary conveying means St picks up the wafer to be measured and moves along the linear motor guide 200 from the position 100b to the position 100c in the same manner as that described regarding the first embodiment, thereby conveying the wafer from the position Wj to the position Wc. Then, the wafer is introduced from the position Wc into the stepper 20 by the main conveying means Mt through the conveying path portion Mta. In the stepper, the line width of the resist pattern formed on the wafer is measured in the same manner as that mentioned above. Then, the wafer is conveyed from the stepper 20 to the position Wi by the main conveying means Mt through the conveying path portion Mtc. Further, the auxiliary conveying means St conveys the wafer from the position Wi to the position Wj. In this way, in this second embodiment, the same effect can be achieved as that in the afore-mentioned first embodiment.

Figure 6:
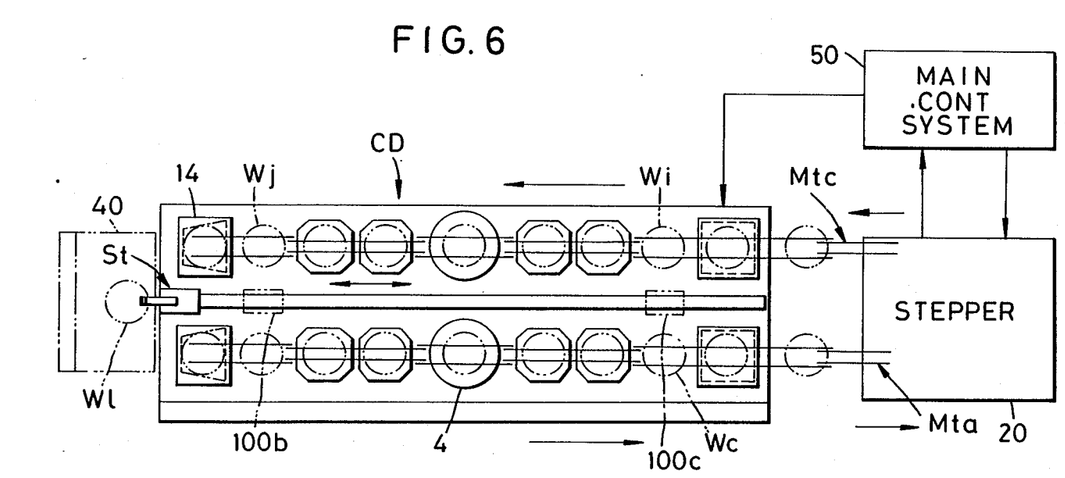
FIG. 6 is a schematic constructional plan view of a substrate processing system according to an alternation of the embodiment of the present invention.

Further, as shown in FIG. 6, an inspection device 40 such as a wafer prober may be provided. In this case, the wafer having the developed resist pattern formed thereon is conveyed from the position Wj to the inspection device 40 (position Wl) by the auxiliary conveying means St. In the inspection device, for example, the defect of the wafer may be checked.

With this arrangements and/or inspections (for example, measurement in the stepper and inspection in the inspection device), thus further shortening the set up time in the initiation of the substrate processing system, thereby achieving high through put.

In addition, since the coater-developer associated with the auxiliary conveying means St is used, when the abnormity occurs in the wafer processing operations in the wafer processing units, for example, when it is impossible to perform the sufficient treatments of the wafer due to the presence of the insufficient or wrong wafer which is caused, for example, by insufficient application of the resist onto the wafer if the resist in the coater 4 is used up, the auxiliary conveying means St can move the wrong wafer from the abnormality occurring position (in this case, the coater 4) to the position Wj, and then the wrong wafer is received in the unloader cassette 14 through the main conveying means Mt. Thus, it is apparent that the reduction of the processing rate in the coater-developer CD can be effectively prevented.

What is claimed is:

1. A substrate processing system, comprising:
a resist processing apparatus including an applying unit for applying photoresist to a substrate and a developing unit for developing said substrate, which are arranged between a processing start position and a processing end position;
an exposure processing apparatus including means for exposing said substrate and inspection means for inspecting physical condition of the photoresist applied to said substrate;
means forming a first conveying path for conveying said substrate from said processing start position to said exposure processing apparatus through said applying unit;
means forming a second conveying path for conveying said substrate from said exposure processing apparatus to said processing end position through said developing unit;
means forming a bypass conveying path provided for conveying said substrate independently of said second conveying path, between a predetermined position on said second conveying path and said exposure processing apparatus; and
control means for controlling said means forming the bypass conveying path and said inspection means in such a manner that said substrate is conveyed from said second conveying path to said exposure processing apparatus by said bypass conveying path and is inspected by said inspection means.

2. A substrate processing system according to claim 1, wherein said means forming the bypass conveying path connects a portion of said second conveying path positioned between said developing unit and said processing end position to said exposure processing apparatus, whereby said substrate passed through said developing unit is returned to said exposure processing apparatus.

3. A substrate processing system according to claim 1, wherein said control means includes means for determining a processing condition of at least one of said resist processing apparatus and said exposure processing apparatus, on the basis of said physical condition of the photoresist obtained from said inspection means.

4. A substrate processing system according to claim 1, wherein said control means further controls said means forming the bypass conveying path and said inspection means in such a manner that said substrate inspected by said inspection means is conveyed from said exposure processing apparatus onto said second conveying path by said bypass conveying path.

5. A substrate processing system, comprising:
a resist processing apparatus including an applying unit for applying photoresist to a substrate and a developing unit for developing said substrate, which are arranged between a processing start position and a processing end position;
an exposure processing apparatus for exposing said substrate;
means forming a first conveying path for conveying said substrate from said processing start position to said exposure processing apparatus through said applying unit;
means forming a second conveying path for conveying said substrate from said exposure processing apparatus to said processing end position through said developing unit;

means forming a third conveying path provided for conveying said substrate independently of said first and second conveying paths, between a predetermined position on at least one of said first and second conveying paths and said exposure processing apparatus; and control means for controlling said means the forming third conveying path in such a manner that said substrate is conveyed from said predetermined position to said exposure processing apparatus by said third conveying path.

6. A substrate processing system according to claim 5, wherein said first and second conveying paths have path portions extending in the same direction, respectively, said path portions including said predetermined position, said third conveying path being positioned between said path portions of said first and second conveying paths.

7. A substrate processing system according to claim 6, wherein said means forming the third conveying path includes holding means for picking up said substrate to be conveyed to said exposure processing apparatus at said predetermined position and for bringing said substrate from said exposure processing apparatus to said predetermined position.

* * * * *